United States Patent [19]
Lai et al.

[11] Patent Number: 5,730,615
[45] Date of Patent: Mar. 24, 1998

[54] SIMPLIFIED SOCKET FOR ZIF PGA

[75] Inventors: Ching-ho Lai, Tao-Yuan Hsien; Anderson Su, Taipei, both of Taiwan

[73] Assignee: Hon Hai Precision Ind. Co. Ltd., Taiwan

[21] Appl. No.: 651,721

[22] Filed: May 22, 1996

[51] Int. Cl.⁶ .................................................. H01R 4/50
[52] U.S. Cl. .............................................................. 439/342
[58] Field of Search .................................. 439/342, 259, 439/263, 264, 268

[56] References Cited

U.S. PATENT DOCUMENTS

| | | | |
|---|---|---|---|
| 4,245,877 | 1/1981 | Auriana | 439/342 |
| 4,531,792 | 7/1985 | Oshitani et al. | 439/342 |
| 5,061,197 | 10/1991 | Kuzuno et al. | 439/342 |

*Primary Examiner*—Khiem Nguyen
*Assistant Examiner*—Yong Ki Kim

[57] ABSTRACT

A ZIF PGA socket (10) includes a base (12) and a slidable cover (18) attached thereon wherein a plurality of first passageways (14) extend through the base (12), and a corresponding number of second passageways (20) extend through the cover (18) in alignment with the first passageways (14), respectively. A tool receiving structure is formed on the base (12) and the cover (18), respectively, and includes expansion sections (28, 30) respectively integrally formed on the rear side of the base (12) and the cover (18) wherein each expansion section (28, 30) further includes a receiving slot (32, 34) extending in a lateral direction so that the cover (18) can be actuated to be moved in a front-to-end direction by inserting a flat or plate tool (38) into both the receiving slots (32, 34) of the base (12) and of the cover (18) and successively rearwardly or forwardly swinging such flat tool (38) in the slots (32, 34) wherein this pivotal movement of the flat tool (38) generally has its pivot point set around the bottom surface (36) of the receiving slot (32) of the base (12).

11 Claims, 6 Drawing Sheets

SIMPLIFIED SOCKET FOR ZIF PGA

BACKGROUND OF THE INVENTION

1. Field of the Invention

The invention relates to a ZIF (Zero Insertion Force) socket for use with a PGA (Pin Grid Array) chip, and particularly to a ZIF socket without a lever for horizontally moving the sliding plate with regard to the base but with a tool receiving area for cooperation with an external tool for implementation of such horizontal movement of the sliding plate and achievement of ZIF purpose.

2. The Prior Art

The conventional ZIF PGA socket in the industry includes a base with a slidably moving cover or sliding plate attached thereto and actuated by a cam lever wherein the base and the cover commonly define a channel for allowing the camming section of such cam lever to be rotatably seated therein. Thus, through up-and-down movement of the exposed actuation bar of the cam lever, the cover can be moved horizontally regard to the base in a front-to-end direction by means of the camming section of the cam lever. This basic structure of the ZIF PGA can be referred to U.S. Pat. No. 5,489,217 or FIG. 1.

Recently, for consideration of lowering the cost of the socket, it is intended to eliminate the parts of the socket assembly. On the other hand, the exposed actuation bar takes too much space along its rotation path even though such elongated design of the actuation bar may result in force-saving from a mechanical viewpoint. It is understood that in an interior of the computer case, every minor space should be struggled for, and no significant rotation or linear movement of any sized parts can be ignored. This is the key issue for obtaining a thinner and thinner computer set.

Therefore, an object of the invention is to provide a ZIF PGA socket removing the cam lever therefrom for not only saving the cost of the components, but also avoid any interference occurring due to the rotatively up-and-down the elongated actuation bar of the cam lever against the lower frame structure or against other electrical parts mounted close to such ZIF PGA socket.

SUMMARY OF THE INVENTION

According to an aspect of the invention, a ZIF PGA socket includes a base and a slidable cover attached thereon wherein a plurality of first passageways extend through the base, and a corresponding number of second passageways extend through the cover in alignment with the first passageways, respectively. A tool receiving structure is formed on the base and the cover, respectively, and includes expansion sections respectively integrally formed on the rear side of the base and the cover wherein each expansion section further includes a receiving slot extending in a lateral direction so that the cover can be actuated to be moved in a front-to-end direction by inserting a flat or plate tool into both the receiving slots of the base and of the cover and successively rearwardly or forwardly swinging such flat tool in the slots wherein this pivotal movement of the flat tool generally has its pivot point set around the bottom surface of the receiving slot of the base.

BRIEF DESCRIPTION OF THE DRAWINGS

FIG. 3(A) is an enlarged perspective view of the contact used within the socket of the FIG. 2.

FIG. 3(B) is an enlarged perspective view of the retention boss integrally formed on an exterior surface of the base of the socket of FIG. 2.

DETAILED DESCRIPTION OF THE PREFERRED EMBODIMENTS

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

Figure 1:
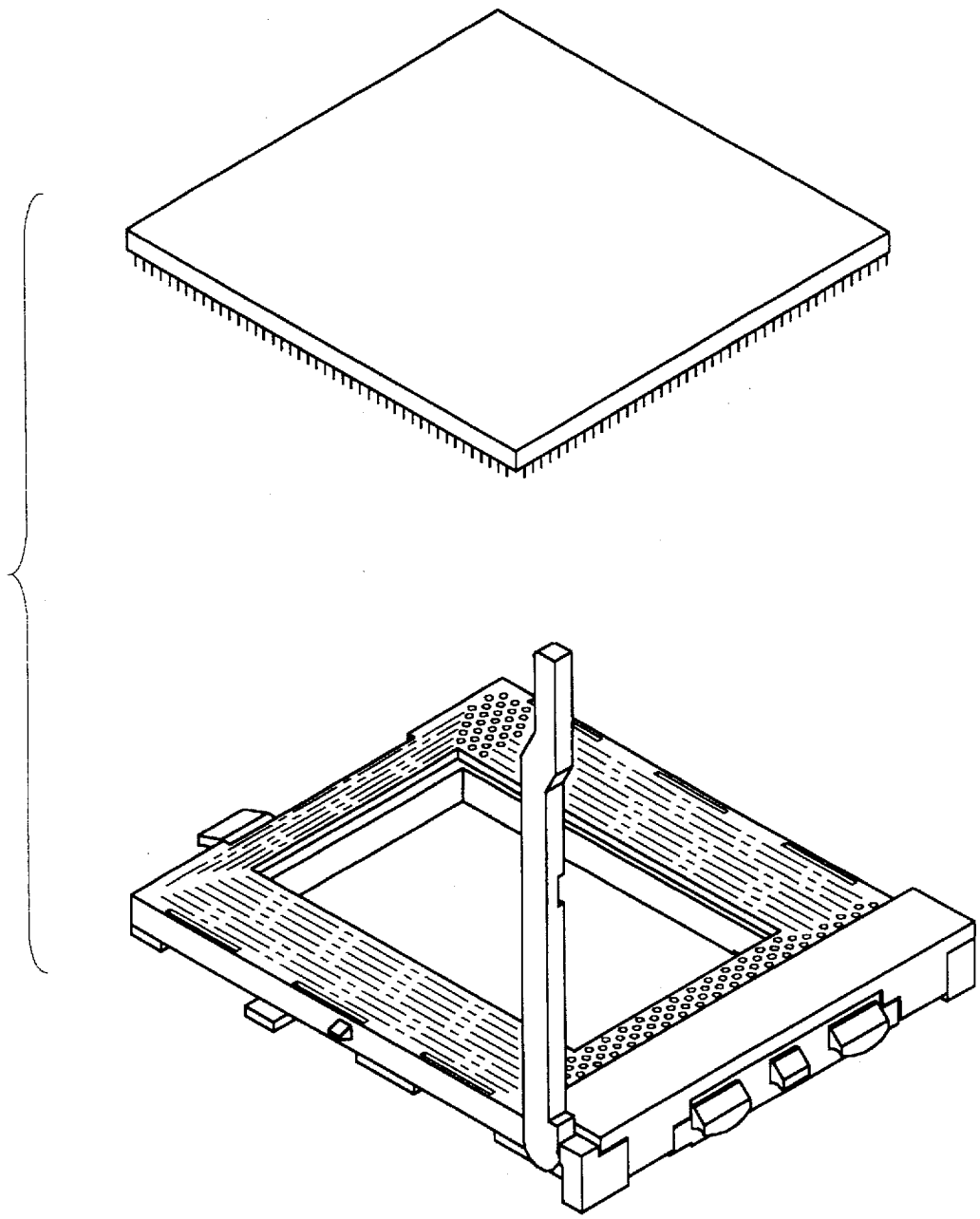
FIG. 1 is a perspective view of a conventional ZIF PGA socket with cam lever thereon.
Figure 2:
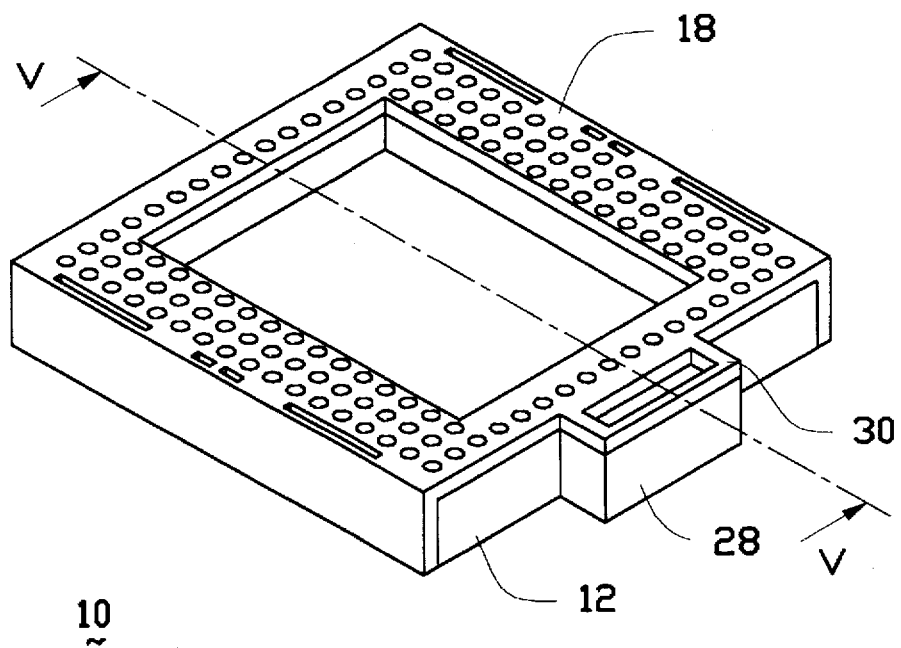
FIG. 2 is a perspective view of a presently preferred embodiment of an assembled ZIF PGA socket according to the invention.
Figure 3:
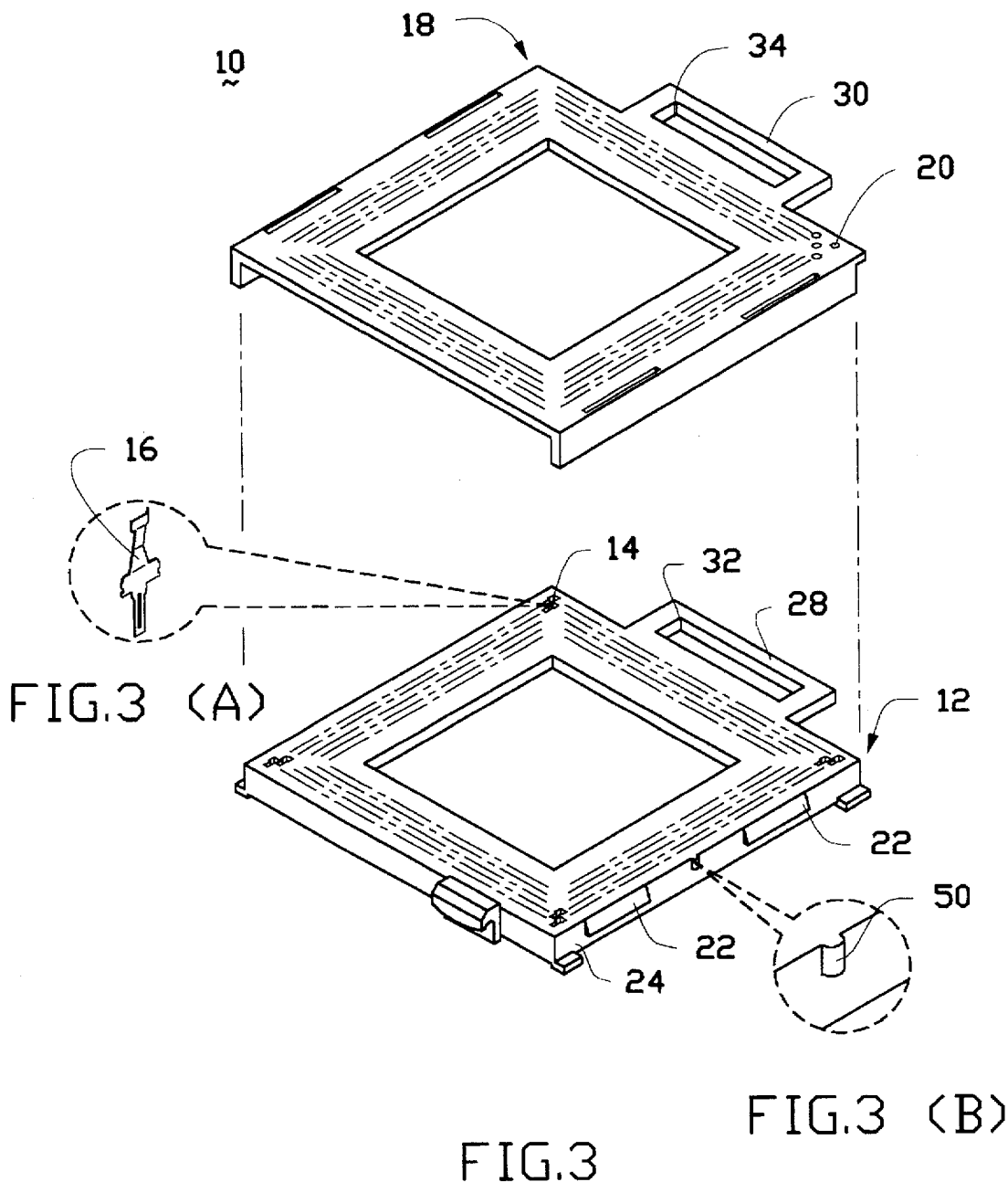
FIG. 3 is an exploded perspective view of the ZIF PGA socket of FIG. 2.
Figure 4:
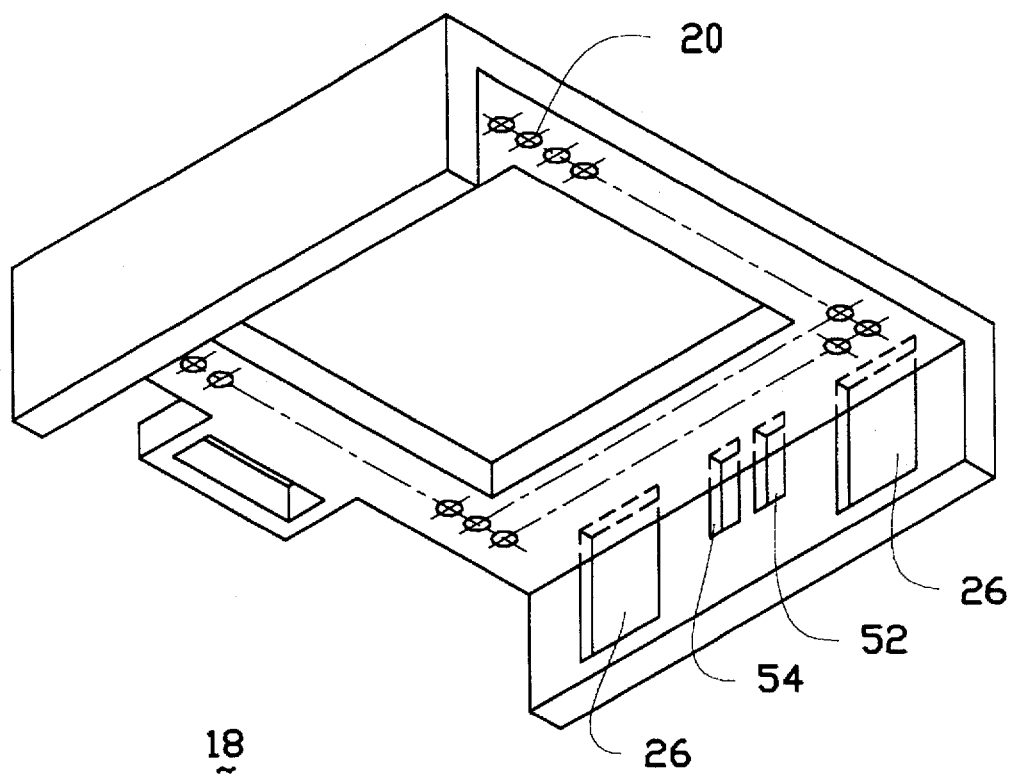
FIG. 4 is a perspective view of the cover of the socket of FIG. 2 to show the interior structures thereof.

It will be noted here that for a better understanding, most of like components are designated by like reference numerals throughout the various figures in the embodiments. Attention is directed to FIGS. 2–4, wherein the subject socket 10 includes a base 12 defining a plurality of first passageways 14 extending therethrough in a vertical direction for receiving a plurality of contacts 16 (FIG. 3(A)) therein. The cover 18 has the similar configuration with the base 12, and also defines a corresponding number of second passageways 20 therethrough in alignment with the corresponding first passageways 14 in the vertical direction.

To avoid the cover 18 to be vertically taken from the base 12, retention barbs 22 are formed on the side surface 24 of the base 12 to be properly engaged within recesses 26 (FIG. 4) formed in the interior portion of the cover 18.

Figure 5:
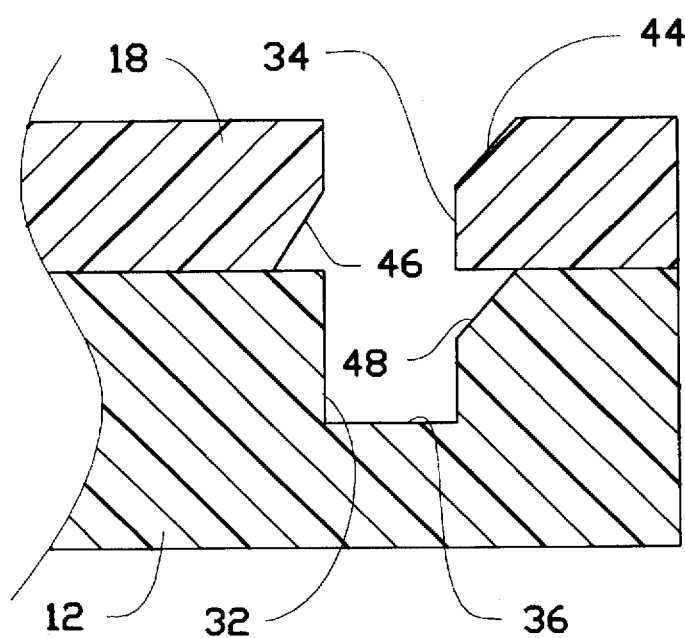
FIG. 5 is a partially cross-sectional view along line V—V of the assembled socket of FIG. 2 including the base and the cover to show the detailed structure around the receiving slots therein.

The feature of the invention is to eliminate the cam lever structure and the corresponding round channel positioned on the rear portion of the socket in the prior art socket, Differently, the base 12 and the cover 18 include respectively expansion sections 28, 30 around the rear portion of the socket 10 and each expansion section includes a tool receiving slot 32, 34 wherein, also referring to FIG. 5, the slot 32 in the base 12 is of a closed type having a bottom surface 36 while the slot 34 of the cover 18 is of a through type.

Figure 6:
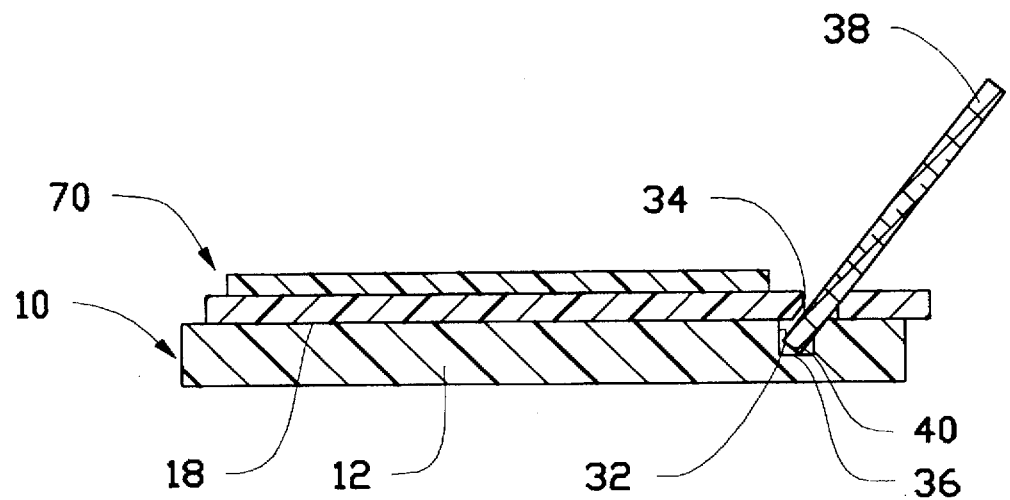
FIG. 6, is a cross-sectional view of the assembled socket of FIG. 2 with a flat tool being inserted into the receiving slots and actuated in a backward slanted manner to move the cover rearwardly for zero insertion force of the PGA chip.
Figure 7:
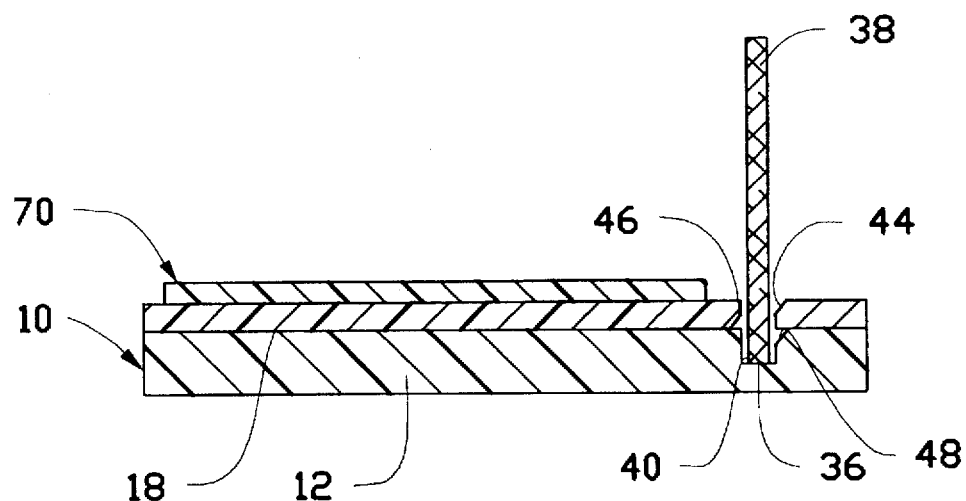
FIG. 7 is a cross-sectional view of the assembled socket of FIG. 2 with a flat tool being inserted into the receiving slots and actuated in a vertical state to move the cover back to its normal position regard to the base for mechanical and electrical engagement between the contacts of the socket and the PGA chip.

Referring to FIGS. 5–7, when the cover 18 and the base 12 are positioned in the closed state with regard to each other as shown in FIGS. 5 and 7, the slot 32 of the base 12 is aligned with the slot 34 of the cover 18. Therefore, if a PGA chip 70 is ready to be installed to the socket 10, a flat tool 38 can be first inserted into the both the slot 34 of the cover 18 and the slot 32 of the base 12 until the bottom edge section 40 of the tool 38 confronts the bottom surface 36 in the slot 32 of the base 12. Successively, the flat tool 38 is rotatably rearward moved by means of the bottom edge section 40 incorporating the bottom surface 36 in the slot 32 regarded as the pivotal point, so that the cover 18 can be correspondingly moved rearwardly as shown in FIG. 6, and the PGA chip 70 may be loaded onto the cover 18 of the socket 10 from the top in a ZIF manner. After the PGA chip 70 has fully loaded onto the socket 10, then the cover 18 can be back to its original vertical aligned position with the base 12, as shown in FIG. 7, by means of the reverse operation of the flat tool 38, i.e., rotatably forward movement of the flat tool 38 with regard to the base 12. Thus, the pins (not shown) of the PGA chip 70 can be electrically and mechanically engaged with the contacts 16 of the socket 10.

Referring to FIG. 5, it can be seen that to facilitate actuation of the flat tool 38 with regard to the cover 18 and the base 12, adjacent the corresponding slot 34, the cover includes a first chamfer 44 on the rear top portion and a second chamfer 46 on the front bottom portion. Similarly, the base 12 includes a third chamfer 48 around the rear top portion in the slot 32.

Moreover, referring to FIGS. 3 and 4, to properly retain the cover 18 with regard to the base 12 in either an open (rear) position or a closed (front) position, the base 12 includes a vertical protrusion 50 on the side surface 24 to cooperate with a pair of spaced shallows 52 and 54 formed in the interior portion of the cover 18. Therefore, the protrusion 50 of the base may be received within the front shallow 52 in the cover 18 when the socket 10 is in an open state, and within the rear shallow 54 when the socket is in a closed state. This structure provides more stability of the cover 18 with regard to the base 12.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, person of ordinary skill in this field are to understand that all such equivalent structures are to be included within the scope of the following claims.

We claim:

1. A socket for use with a chip including:
   a base defining a plurality of first passageways extending vertically therethrough for receiving a corresponding number of contacts therein;
   a cover defining a plurality of second passageways extending vertically therethrough in alignment with the first passageways, respectively;
   at least a first expansion section formed on the base and a first receiving slot formed on said first expansion section, and at least a second expansion section formed on the cover and having a second receiving slot therein in compliance with said first receiving slot in the base, and at least a chamfer formed around either a rear top portion or a front bottom portion of said second receiving slot, for cooperation with an external actuation tool, whereby said actuation tool may incorporate said receiving slots to have the cover move in a front-to-end direction by means of pivotal movement of said tool on a bottom edge section of said tool and abut against at least a chamfer.

2. The socket as described in claim 1, wherein said first receiving slot includes a bottom surface for supportable engagement with the bottom edge section of the tool.

3. The socket as described in claim 1, wherein said second receiving slot is substantially of a through type.

4. The socket as described in claim 1, wherein said socket includes retention means for properly retaining the cover with regard to the base in either a front closed position or a rear open position.

5. The socket as described in claim 4, wherein said retention means includes at least a protrusion formed on one of the base and the cover, and at least a pair of spaced shallows formed in another of the base and the cover.

6. The socket as described in claim 1, where a chamfer is formed around a rear top portion in the first receiving slot of the base.

7. A method for actuating a cover of a ZIF PGA socket with regard to a base thereof, including the steps:
   forming a first expansion section having a receiving slot with a bottom surface on at least a rear portion of the base for incorporating an external flat tool;
   engaging said tool with said receiving slot;
   pivotally rotating said tool on a bottom edge section thereof with regard to the base along a forward or a backward direction to abut against a chamfer of either of two opposed sides formed in a second receiving slot of the cover so as to move said cover corresponding to movement of said tool in a front-to-end direction.

8. A socket for use with a PGA chip having a plurality of leads, including:
   a base defining a plurality of first passageways for receiving a corresponding number of contacts therein;
   a cover defining a plurality of second passageways in alignment with the corresponding first passageways, respectively;
   first means actuating the cover to move in either a first position or a second position, along a front-to-end direction thereof, with regard to the base; and
   second means including at least a protrusion formed on one of the base and the cover, and at least a pair of spaced shallows formed in another of the base and the cover to correspond to one protrusion, for retaining the cover with regard to the base in either said first position or said second position, by means of said protrusion being received within either one of shallows or another.

9. The socket as described in claim 8, wherein said first means include receiving means that may incorporate an external actuation tool to actuate the cover, by means of pivotal movement of said tool on a bottom edge section thereof.

10. The socket as described in claim 8, wherein said first position is a front closed position for secure engagement between the contacts of the base and the leads of said chip, and said second position is a rear open position for the leads of said chip being inserted into the socket in a zero insertion force manner.

11. A socket for use with a PGA chip, including:
    a base defining a plurality of first passageways for receiving a corresponding number of contacts therein;
    a cover defining a plurality of second passageways in alignment with the corresponding first passageways, respectively;
    wherein at least a first receiving slot is formed on said cover and a second receiving slot is formed on the base, for incorporating an external tool to pivot said tool on a bottom edge section of the cover with regard to the base, along a forward or a backward direction, for abutting against either of two opposed sides provided with said first receiving slot wherein at least one of opposed sides has a chamfer, so as to move said cover corresponding to the pivotal movement of said tool in a front-to-end direction.

* * * * *